United States Patent
Kuznetsov et al.

(10) Patent No.: US 8,034,410 B2
(45) Date of Patent: Oct. 11, 2011

(54) PROTECTIVE INSERTS TO LINE HOLES IN PARTS FOR SEMICONDUCTOR PROCESS EQUIPMENT

(75) Inventors: Vladimir Kuznetsov, TA Utrecht (NL); Ernst H. A. Granneman, AD Hilversum (NL)

(73) Assignee: ASM International N.V. (NL)

( * ) Notice: Subject to any disclaimer, the term of this patent is extended or adjusted under 35 U.S.C. 154(b) by 632 days.

(21) Appl. No.: 11/779,033

(22) Filed: Jul. 17, 2007

(65) Prior Publication Data

US 2009/0023302 A1   Jan. 22, 2009

(51) Int. Cl.
*C23C 16/00* (2006.01)
(52) U.S. Cl. .............. 427/249.15; 427/237; 427/249.16; 427/402; 427/419.1
(58) Field of Classification Search ........... 427/8, 248.1, 427/249.15
See application file for complete search history.

(56) References Cited

U.S. PATENT DOCUMENTS

| | | | |
|---|---|---|---|
| 3,011,006 A | 11/1961 | Nicholson | |
| 4,377,347 A | 3/1983 | Hanmyo et al. | |
| 4,592,307 A | 6/1986 | Jolly | |
| 4,692,556 A | 9/1987 | Bollen et al. | |
| 4,976,996 A | 12/1990 | Monkowski et al. | |
| 4,978,567 A | 12/1990 | Miller | |
| 4,984,904 A | 1/1991 | Nakano et al. | |
| 5,006,220 A | 4/1991 | Hijikata et al. | |
| 5,027,746 A | 7/1991 | Frijlink | |
| 5,065,698 A | 11/1991 | Koike | |
| 5,098,198 A | 3/1992 | Nulman | |
| 5,104,514 A | 4/1992 | Quartarone | |
| 5,246,500 A | 9/1993 | Samata et al. | |
| 5,271,967 A | 12/1993 | Kramer et al. | |
| 5,315,092 A | 5/1994 | Takahashi et al. | |
| 5,336,327 A | 8/1994 | Lee | |
| 5,360,269 A | 11/1994 | Ogawa et al. | |
| 5,421,893 A | 6/1995 | Perlov | |
| 5,456,757 A * | 10/1995 | Aruga et al. | 118/723 E |
| 5,456,761 A | 10/1995 | Auger et al. | |
| 5,474,618 A | 12/1995 | Allaire | |
| 5,493,987 A | 2/1996 | McDiarmid et al. | |
| 5,514,439 A | 5/1996 | Sibley | |

(Continued)

FOREIGN PATENT DOCUMENTS

EP   0 229 488   12/1988

(Continued)

OTHER PUBLICATIONS

Linke, J. and Vietzke, E., "Behavior of Boron Doped Graphites, Plasma Sprayed Boron Carbides and a-C/B:H as Plasma Facing Material," *J. Fusion Tech.*, vol. 20, pp. 228-231 (Sep. 1991).

(Continued)

*Primary Examiner* — David Turocy
(74) *Attorney, Agent, or Firm* — Knobbe, Martens, Olson & Bear LLP

(57) ABSTRACT

Inserts are used to line openings in parts that form a semiconductor processing reactor. In some embodiments, the reactor parts delimit a reaction chamber. The reactor parts may be formed of graphite. A layer of silicon carbide is deposited on surfaces of the openings in the reactor parts and the inserts are placed in the openings. The inserts are provided with a hole, which can accept another reactor part such as a thermocouple. The insert protects the walls of the opening from abrasion caused by insertion of the other reactor part into the opening.

19 Claims, 6 Drawing Sheets

U.S. PATENT DOCUMENTS

| | | | |
|---|---|---|---|
| 5,562,774 | A | 10/1996 | Breidenbach et al. |
| 5,571,333 | A | 11/1996 | Kanaya |
| 5,618,594 | A * | 4/1997 | Tulloch et al. ............... 428/34.1 |
| 5,685,906 | A * | 11/1997 | Dietze et al. .................. 117/101 |
| 5,688,331 | A * | 11/1997 | Aruga et al. ................... 118/725 |
| 5,788,799 | A | 8/1998 | Steger et al. |
| 5,817,406 | A * | 10/1998 | Cheung et al. ................. 428/210 |
| 5,902,407 | A | 5/1999 | deBoer et al. |
| 5,904,778 | A | 5/1999 | Lu et al. |
| 5,910,221 | A | 6/1999 | Wu |
| 5,998,767 | A * | 12/1999 | Kersch et al. ................. 219/390 |
| 6,024,799 | A | 2/2000 | Chen et al. |
| 6,056,823 | A | 5/2000 | Sajoto et al. |
| 6,066,209 | A | 5/2000 | Sajoto et al. |
| 6,086,680 | A * | 7/2000 | Foster et al. .................. 118/725 |
| 6,120,640 | A | 9/2000 | Shih et al. |
| 6,129,808 | A | 10/2000 | Wicker et al. |
| 6,162,543 | A | 12/2000 | Dubots et al. |
| 6,170,429 | B1 | 1/2001 | Schoeppe et al. |
| 6,174,481 | B1 * | 1/2001 | Holowczak et al. .......... 264/225 |
| 6,205,869 | B1 * | 3/2001 | Schadt et al. .............. 73/863.71 |
| 6,227,140 | B1 | 5/2001 | Kennedy et al. |
| 6,325,858 | B1 | 12/2001 | Wengert et al. |
| 6,342,691 | B1 | 1/2002 | Johnsgard et al. |
| 6,408,786 | B1 | 6/2002 | Kennedy et al. |
| 6,454,860 | B2 | 9/2002 | Metzner et al. |
| 6,506,254 | B1 | 1/2003 | Bosch et al. |
| 6,524,428 | B2 | 2/2003 | Tamura et al. |
| 6,592,707 | B2 | 7/2003 | Shih et al. |
| 6,635,115 | B1 | 10/2003 | Fairbairn et al. |
| 6,692,576 | B2 * | 2/2004 | Halpin et al. .................. 118/730 |
| 6,890,861 | B1 | 5/2005 | Bosch |
| 6,942,753 | B2 | 9/2005 | Choi et al. |
| 2003/0029563 | A1 | 2/2003 | Kaushai et al. |
| 2003/0035905 | A1 | 2/2003 | Lieberman et al. |
| 2003/0198749 | A1 | 10/2003 | Kumar et al. |
| 2004/0060658 | A1 | 4/2004 | Nishimoto et al. |
| 2004/0208228 | A1 * | 10/2004 | Hashikura et al. ............ 374/179 |

FOREIGN PATENT DOCUMENTS

| | | |
|---|---|---|
| EP | 0 723 141 A1 | 12/1995 |
| JP | 5-64627 | 5/1993 |
| JP | 2003197546 A * | 7/2003 |
| WO | WO 95/31582 | 11/1995 |
| WO | WO 97/06288 | 2/1997 |
| WO | WO 99/23276 | 5/1999 |
| WO | WO 01/11223 | 11/2002 |

OTHER PUBLICATIONS

Ponnekanti et al., "Failure mechanisms of anodized aluminum parts used in chemical vapor deposition chambers," *J. Vac. Sci. Technol.*, A14(3) (May 1, 1996).

Shackelford, J. "Introduction to Materials Science for Engineers," 3d ed., Macmillan Publishing Co., pp. 398 (1992).

Pending U.S. Appl. No. 11/856,418, filed Sep. 17, 2007, entitled "Semiconductor Processing Parts Having Apertures With Deposited Coatings and Methods for Forming the Same" in the name of Kuznetsov.

* cited by examiner

US 8,034,410 B2

PROTECTIVE INSERTS TO LINE HOLES IN PARTS FOR SEMICONDUCTOR PROCESS EQUIPMENT

BACKGROUND

1. Field

This invention relates to semiconductor processing equipment and, more particularly, to inserts for protecting openings in semiconductor processing equipment parts.

2. Description of the Related Art

Semiconductor processing reactors typically include one or more process chambers that accommodate substrates for processing. Inside a process chamber, a substrate may be subjected to various processes. For example, the substrate may be subjected to vapor deposition processes or nitridation or oxidation processes that involve subjecting the substrate to highly reactive chemical species.

The chemical species, temperatures and pressures inside the process chamber can present a harsh environment for the reactor parts forming interior surfaces of the process chamber. In the course of processing a substrate, those parts may become damaged. This damage to the reactor parts may adversely affect process results or may necessitate an expensive replacement of the process chamber walls or other reactor parts.

Accordingly, there is a need for methods and apparatus for protecting semiconductor reactor parts from damage during substrate processing.

SUMMARY OF SOME EMBODIMENTS

In accordance with some embodiments of the invention, a method for fabricating a semiconductor processing reactor part is provided. The method comprises providing a partially-fabricated reactor part having an opening on a surface of the partially-fabricated reactor part. A protective coating is deposited on a surface of the opening. An insert is subsequently placed into the opening. The insert has a cavity extending along at least part of a length of the insert.

In accordance with other embodiments of the invention, a method for making a part for a semiconductor processing reactor is provided. The method comprises providing a first semiconductor reactor part. The reactor part has a hole. An insert is placed into the hole. A second semiconductor reactor part is inserted into an opening in the insert.

In accordance with other embodiments of the invention, a semiconductor processing reactor part for defining a reaction chamber for processing a semiconductor substrate. The reactor part comprises a surface configured to delimit at least part of the reaction chamber. A protective insert is disposed within the reactor part. The protective insert does not extend beyond the surface of the reactor part. A wall of the protective insert defines a cavity extending along at least part of a length of the protective insert. The wall has a thickness of about 0.05 mm or more.

DETAILED DESCRIPTION OF SOME EMBODIMENTS

Figure 1:
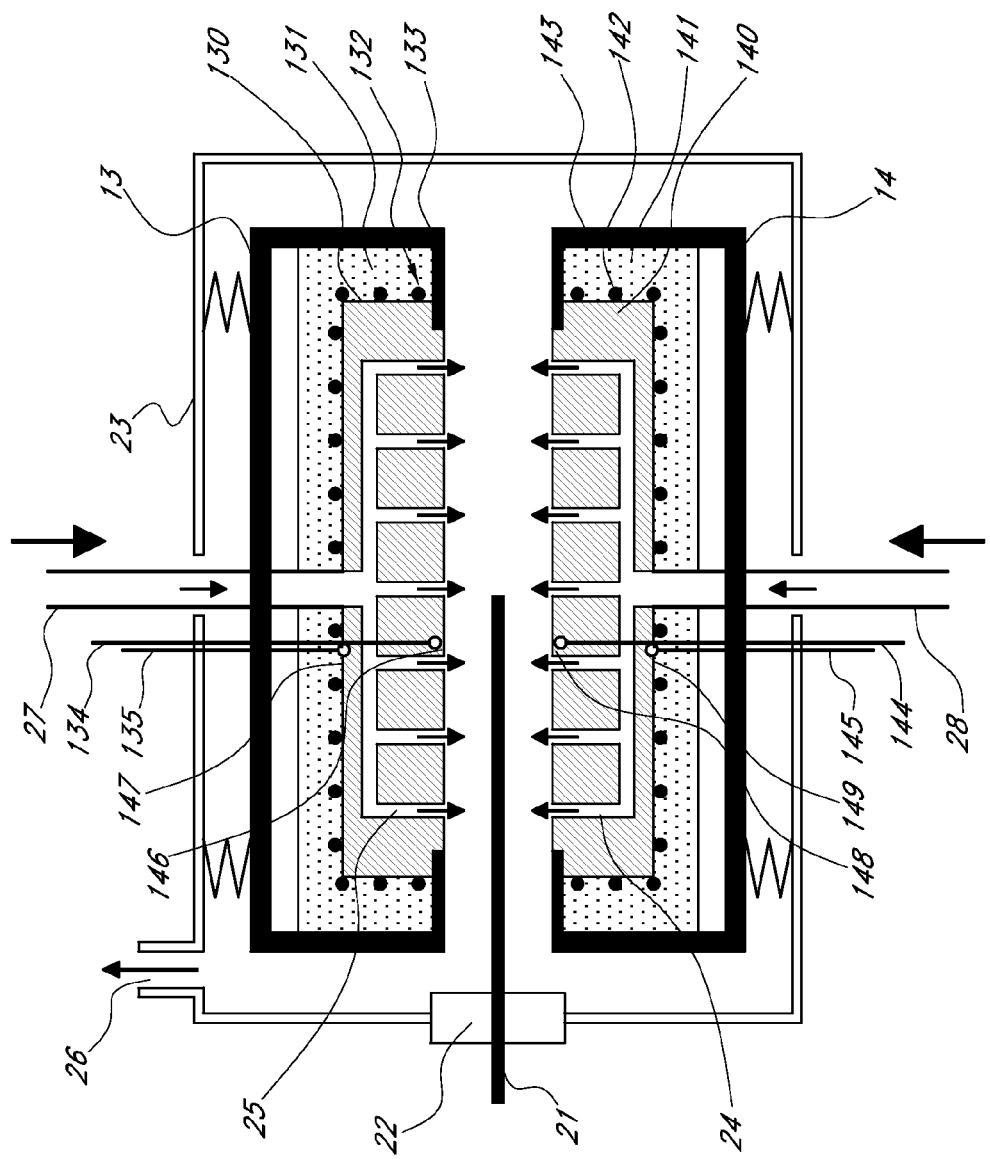
FIG. 1 is a schematic, cross-sectional side view of a semiconductor processing reactor, in accordance with embodiments of the invention.

Many different parts are typically fit together to form a semiconductor processing reactor. A first reactor part may have openings, such as holes or grooves, for accommodating a second reactor part. One or both of the reactor parts may be coated with a protective material to protect that part from exposure to reactive chemical species during semiconductor processing. The protective coating is more resistant to the harsh process environment of a process chamber than the material of the parts themselves. However, it has been found that the act of inserting and removing the second reactor part into and from an opening can cause undesired mechanical damage, including abrasion and removal of the protective coating. As a result, the reactor part may be left prone to damage caused by exposure to process gases during semiconductor processing.

In addition to possible removal of a protective coating due to abrasion, it has been found that the protective coating near the bottom of an opening may be relatively thin or may have incomplete coverage due to limited diffusion of coating precursors into the opening. Consequently, the bottoms of openings may not be completely coated in the first instance or may be more easily damaged relative to upper parts of the opening due to the thin protective coating overlying them.

It will be appreciated that the reactor parts may be formed of materials that can be damaged by exposure to process gases. For example, the parts may be formed of graphite. These graphite parts may be damaged by exposure to oxygen. The oxygen reacts with the graphite in a combustion reaction that causes the graphite to "burn."

For example, susceptors for supporting substrates or reactor blocks for defining the interior surfaces of a process chamber may be formed of graphite and may include openings for accepting thermocouple assemblies. As a thermocouple assembly is inserted into a hole, however, the assembly may rub off part of the protective coating around and in the hole, or the bottom of the hole may have gaps in the protective coating due to limited deposition of the coating at the bottom of the hole. Moreover, abrasion and removal of the protective coating is exacerbated during servicing of the assemblies, since the assemblies may be repeatedly removed and reinserted into the openings during the life of the reactor. As a result, process gases may contact and undesirably react with the graphite under the coating, causing the reactor part to burn.

Embodiments of the invention protect openings in a reactor parts from exposure to process gases. The insert is placed in an opening in a first reactor part. The insert has its own opening to accommodate a second reactor part, such as a thermocouple assembly. The insert provides a more durable and/or thicker protective layer than a deposited coating, thereby protecting the opening from abrasion caused by placing and removing the second reactor part into and from the opening. The insert also can help to seal or constrict the flow of the process gases into the bottom of the opening, thereby limiting the exposure of the bottom of the opening to process gases, thereby protecting the bottom of the opening even where a protective coating at the bottom of the opening incompletely covers the bottom.

In some embodiments, before being placed in the opening, a protective coating may be deposited over the surfaces of the opening and the first reactor part. The protective coating may be used to protect surfaces of the first reactor part generally. The insert may then be placed in the opening of the first reactor part. A second reactor part, such as a thermocouple assembly, may be placed into—a cavity in the insert.

In some embodiments, a second coating may be deposited over the surfaces of the insert and the first reactor part before placing the second reactor part into the insert. The second coating may be used to seal the insert in the opening in the first reactor part and also has advantages for gas-tightness and reinforcing the structural integrity of the first reactor part/insert construction. In other embodiments, the insert may be secured within the opening using an fastener, e.g., a plate fitted over the insert and the opening.

Reference will now be made to the Figures, wherein like numerals refer to like parts throughout. The Figures are not necessarily drawn to scale.

It will be appreciated that the preferred embodiments may be applied to various reactors known to those of skill in the art, but has particular advantages when used in a floating substrate reactor. For example, the reactor design illustrated in FIG. 1 does not require that a substrate 21 be mechanically supported during processing; that is, the substrate 21 can be processed without being directly contacted by a solid support. This enables very uniform and rapid heating of the substrate 21 without the cold spots that may occur in reactors where substrates are mechanically contacted during a semiconductor fabrication process. In addition, the upper and lower blocks 13 and 14 of the reactor 1 surrounding the substrate are preferably relatively massive such that each has a high heat capacity relative to the substrate 21, helping to stabilize the temperature of the reactor 1 to temperature fluctuations upon loading and unloading of the substrate 21 into the reactor 1. A reactor having the basic configuration of the reactor 1 is available commercially under the trade name Levitor® from ASM International, N.V. of The Netherlands.

With continued reference to FIG. 1, the heat treating apparatus of the reactor 1 includes an upper block 13 and a lower block 14 that are in a housing 23. It will be appreciated that the surfaces of the blocks 13 and 14 facing each other delimit a chamber for processing or treating a substrate 21. As shown in FIG. 1, the housing 23 is provided with a flap 22 that can be opened for loading and subsequently removing a substrate 21. The lower block 14 and the upper block 13 can be moved towards one another by lifting rods 27 and 28. Alternatively, only one of the blocks is moveable.

The upper block 13 is made up of an upper furnace body 130, an insulating jacket 131, a heating coil or furnace body heater 132 arranged on the inside of the insulating jacket 131, and an outer jacket 133. Similarly, the lower block 14 is made up of a lower furnace body 140, an insulating jacket 141, a heating coil 142 arranged on the inside of the insulating jacket 141, and an outer jacket 143. In some embodiments, each furnace body 130, 140 has a mass greater than 10 times or greater than 40 times the mass of a substrate for which the reactor 1 is designed to accommodate.

The upper furnace body 130 is preferably provided with at least one temperature sensor 134 and the lower furnace body 140 is preferably also provided with at least one temperature sensor 144. The temperature sensors 134, 144 are arranged to measure temperatures close to the surfaces 146 and 148 of the furnace bodies 130, 140, respectively, that are adjacent to the substrate 21. The temperature sensors 134, 144 are placed sufficiently close to the furnace body surfaces 146 and 148 to gauge the process temperatures experienced by the substrate 21 during a heat treatment and to detect a reduction in temperature of the furnace bodies 130, 140 caused by positioning of the substrate 21 in its vicinity for heat treatment.

The upper furnace body 130 may also be provided with at least one other temperature sensor 135 that is arranged close to the heater side 147 of the upper furnace body 130. In a similar manner, the lower furnace body 140 may be provided with a temperature sensor 145 arranged close to the side 149 of the lower furnace body 140. The temperature sensors 135, 145 may be used to gauge the temperature gradient across the thickness of the furnace bodies 130, 140, respectively.

Process gases (including inert gases) are supplied both from the upper furnace body 130 through openings 25 and the lower furnace body 140 through openings 24. The gases can be discharged through a discharge opening 26 formed in the reactor housing 23.

Figure 2:
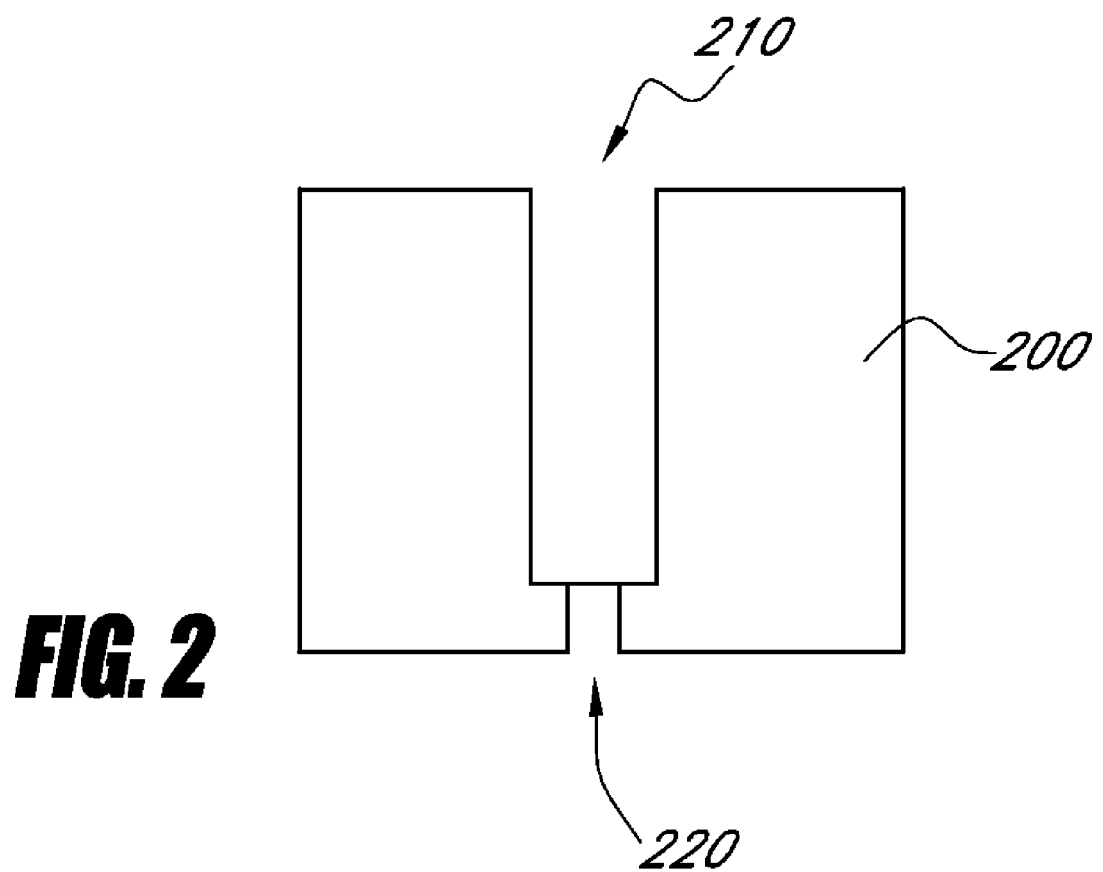
FIG. 2 is a schematic, cross-sectional side view, in isolation, of an opening in a part of a semiconductor processing reactor, in accordance with embodiments of the invention.

The upper block 13 and the lower block 14 are preferably moved apart before introducing the substrate 21 into the reactor 1, as shown in FIG. 1. After the substrate 21 has been introduced into the reactor 1, the blocks 13 and 14 are moved towards one another by the lifting rods 27 and 28 in such a way that the distance between the substrate 21 and the adjacent surfaces 146 and 148 of the furnace bodies 130 and 140, respectively, is reduced. Preferably, when positioned at a heat treatment position, the substrate 21 is less than about 2 mm and more preferably less than about 1 mm from the surfaces 146 and 148. In the illustrated embodiment, as shown in FIG. 2, the substrate is held in a stable position by gas streams issuing from the openings 24 and 25, without requiring further mechanical support. It will be appreciated, however, that in other arrangements, support structures such as support pins may be used to support and space the substrate from the bodies 130 and 140. Moreover, while illustrated as being symmetrically spaced from the bodies 130 and 140, the substrate 21 may be spaced closer to one or the other of the bodies 130 or 140 in other arrangements.

With reference to FIG. 2, a portion of a reactor part 200 is shown. The reactor part 200 may form various structures of a reaction chamber. For example, the part 200 may be a susceptor or a furnace body, such as one of the furnace bodies 130, 140 (FIG. 1). The reactor part 200 may be formed of various materials compatible with semiconductor fabrication, including, without limitation, graphite.

An opening 210 is disposed in the reactor part 200. The opening 210 is sized to accommodate an insert 260 (FIG. 4), which will later be placed into the opening 210. The opening 210 may extend partly or completely through the reactor part 200. Having the opening 210 extend through the reactor part 200 has advantages for allowing for a more uniform deposition of protective coating on surfaces 250 of the opening 210, in embodiments where such a protective coating is applied. In the illustrated embodiment, the opening 210 extends through the reactor part 200, but narrows at one end to a smaller opening 220. The narrowing may be used to prevent the later inserted insert 260 from falling out of the opening 210 on the side of the smaller opening 220.

Figure 3:
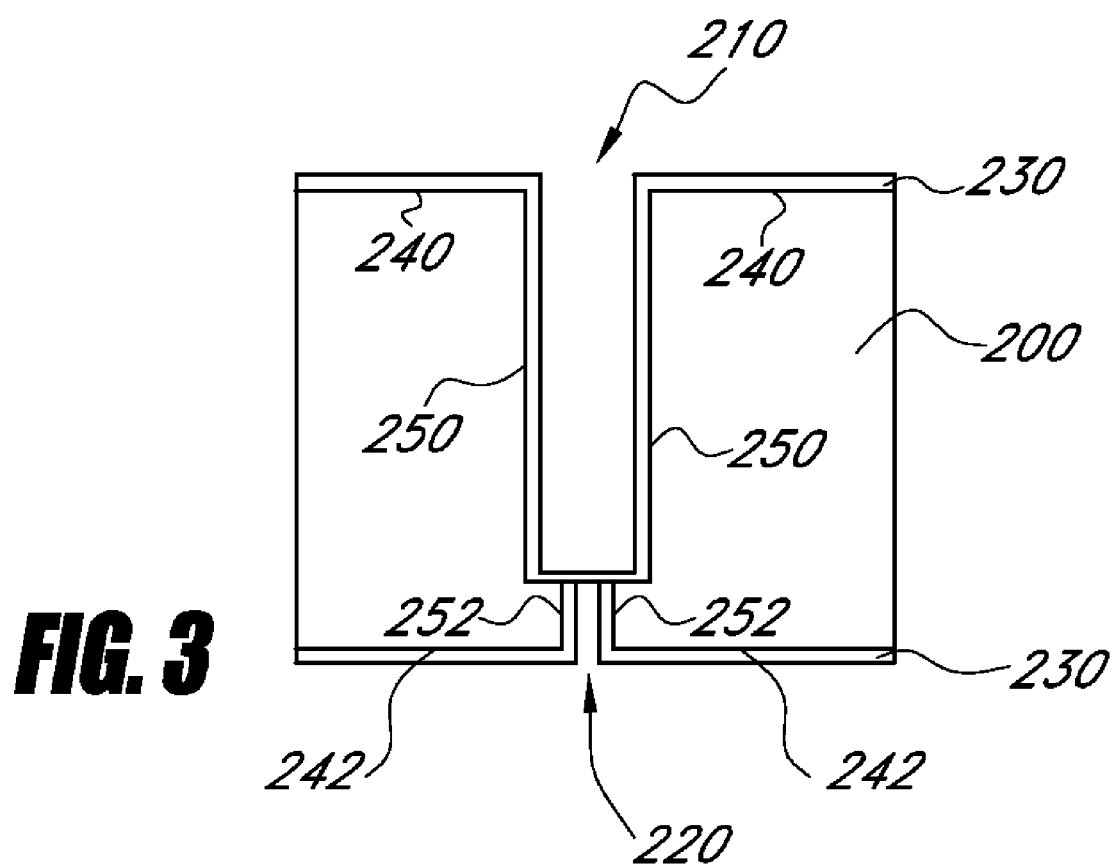
FIG. 3 is a schematic, cross-sectional side view of the structure of FIG. 2 after depositing a protective layer of material, in accordance with embodiments of the invention.

With reference to FIG. 3, a protective coating 230 is applied on exposed surfaces of the reactor part 200. In the illustrated embodiment, the protective coating 230 coats top surfaces 240, bottom surfaces 242 and interior hole surfaces 250, 252 of the reactor part 200. In some embodiments, it will be appreciated that the narrow hole 220 aids deposition into lower parts of the opening 210 by allowing gas to flow through the opening 210, thereby improving the diffusion of process gases into the opening 210. The protective coating 230 may be formed of any material suitable for protecting the reactor part 200 during semiconductor fabrication and which is suitable for deposition on the surfaces of the reactor part. In some embodiments, the protective coating 230 is formed of silicon carbide, which is deposited by chemical vapor deposition. It will be appreciated that the protective coating 230 is deposited to a desired thickness for protecting the top and/or bottom surfaces 230, 240 of the reactor part 200, although this thickness may be reduced if additional protective layers, such as that forming the layer 232 (FIG. 7), are subsequently deposited on those surfaces.

Figure 4:
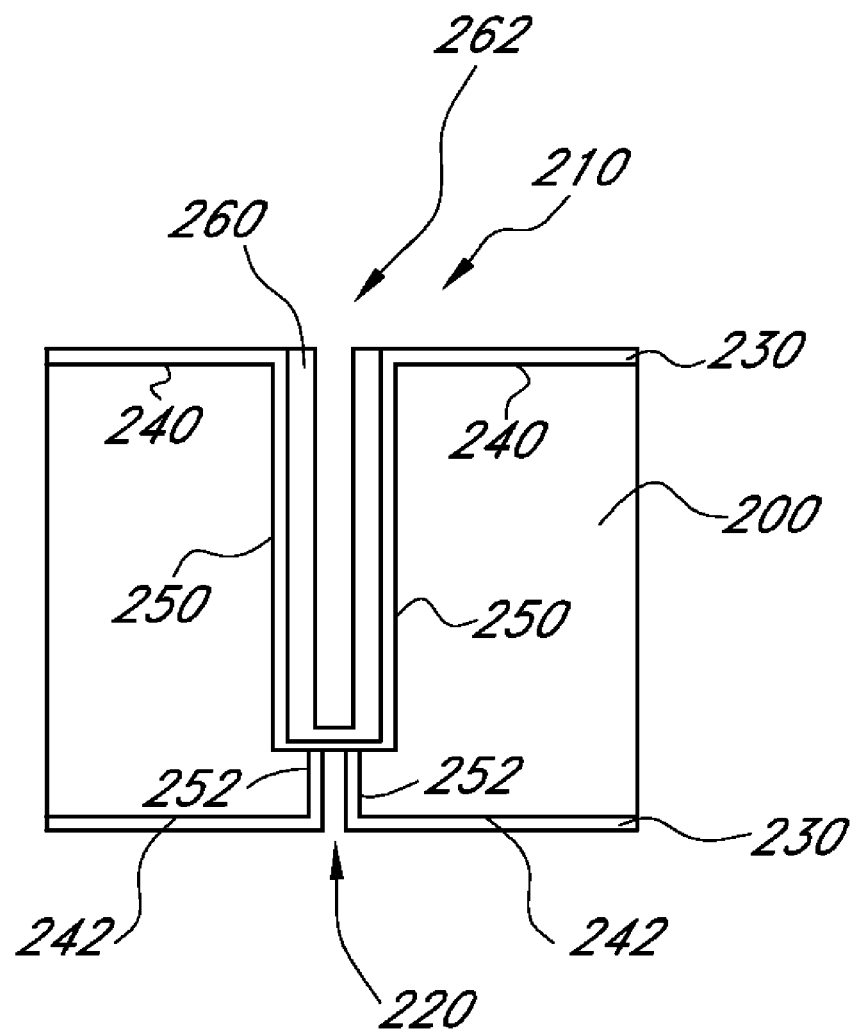
FIG. 4 is a schematic, cross-sectional side view of the structure of FIG. 3 after installing an insert into the opening, in accordance with embodiments of the invention.

With reference to FIG. 4, a protective insert 260 is placed into the opening 210. The protective insert 260 is provided with its own opening or cavity 262. The insert opening 262 is sized and shaped to accommodate another reactor part, such a thermocouple assembly 270 (FIG. 5), which will later be installed. As illustrated, the protective insert 260 extends up to a top of the protective coating 230 or less. The walls of the protective insert 260 are preferably sufficiently thick and durable to provide a barrier to shield the surfaces 250 of the opening 210 from abrasion caused by insertion and removal of parts into the opening 262. In addition, the walls of the protective insert 260 preferably also confer sufficient structural rigidity to the protective insert 260 to allow the protective insert 260 to exist in free-standing form. In some embodiments, the walls of the protective insert 260 is more than about 0.05 mm thick and, preferably, is about 0.05-2.0 mm thick.

The protective insert 260 may be formed of various materials suitable for protecting the reactor part 200 from, e.g., undesired exposure to process gases. For example, the protective insert 260 may be formed of the same material as the protective coating 230. The protective insert is formed of silicon carbide in some embodiments.

Various methods known in the art may be used to fabricate the protective insert 260. For example, the protective insert 260 can be formed over a form that has an outer shape that corresponds to the desired shape for the opening 262 in the protective insert 260. The form may then be removed to leave the protective insert 260. In one embodiment, silicon carbide is deposited around a graphite rod or bar, e.g., by chemical vapor deposition. The rod or bar is then removed, e.g., by being burned out in an oxygen ambient to leave a free-standing protective insert 260.

It will be appreciated that the protective insert 260 is preferably prevented from dislodging out of the opening 210. In some embodiments, the sizes of the opening 210 and the protective insert 260 may be selected so that the protective insert 260 fits tightly within the opening 210. This tight fit helps to retain the protective insert 260 in the opening 210.

In some embodiments, the fit of the protective insert 260 in the opening 210 may be made tighter by utilizing the expansion and contraction of materials at different temperatures. For example, the protective insert 260 can be provided at a lower temperature than the reactor part 200, so that when the temperatures of the protective insert 260 and the reactor part 200 equilibrate or reach the ambient temperature, the protective insert 260 expands and/or the reactor part 200 contracts to increase the tightness of the fit of the protective insert 260 in the opening 210. In some embodiments, the protective insert 260 is cooled, e.g., by exposure to liquid nitrogen, to cause the protective insert 260 to contract relative to the reactor part 200. Alternatively, or in addition, the reactor part 200 is heated to cause the reactor part 200 to expand relative to the protective insert 260. The protective insert 260, which is at a lower temperature than the reactor part 200, is then inserted into the opening 210 of the reactor part 200, which is at a higher temperature than protective insert. It will be appreciated that the protective insert 260 may also be at a lower temperature than the ambient environment and the reactor part 200 may be at a higher temperature than the ambient environment.

It will also be appreciated that the materials forming the protective insert 260 and the hot reactor part 200 may be selected to have similar thermal expansion coefficients, to prevent loosening of a tight fit due to differential expansion of the materials. It will appreciated that, where the thermal expansion coefficient of the reactor part 200 is larger than the thermal expansion coefficient of the protective insert 260, the reactor part 200 may expand more than the protective insert 260 as the process chamber is heated. As a result, the hole 210 may become larger than the protective insert 260, thereby undesirably loosening the tight fit of the protective insert 260 within the hole 210.

In some embodiments, the reactor part 200 is formed of graphite and the protective insert 260 is formed of silicon carbide. Advantageously, silicon carbide coatings have proven to adhere very well on graphite and the two materials match well together. For metal reactor parts such as stainless steel, Inconel®, Hastelloy® and high temperature steels, a TiN or BN insert would be suitable matches.

Figure 5:
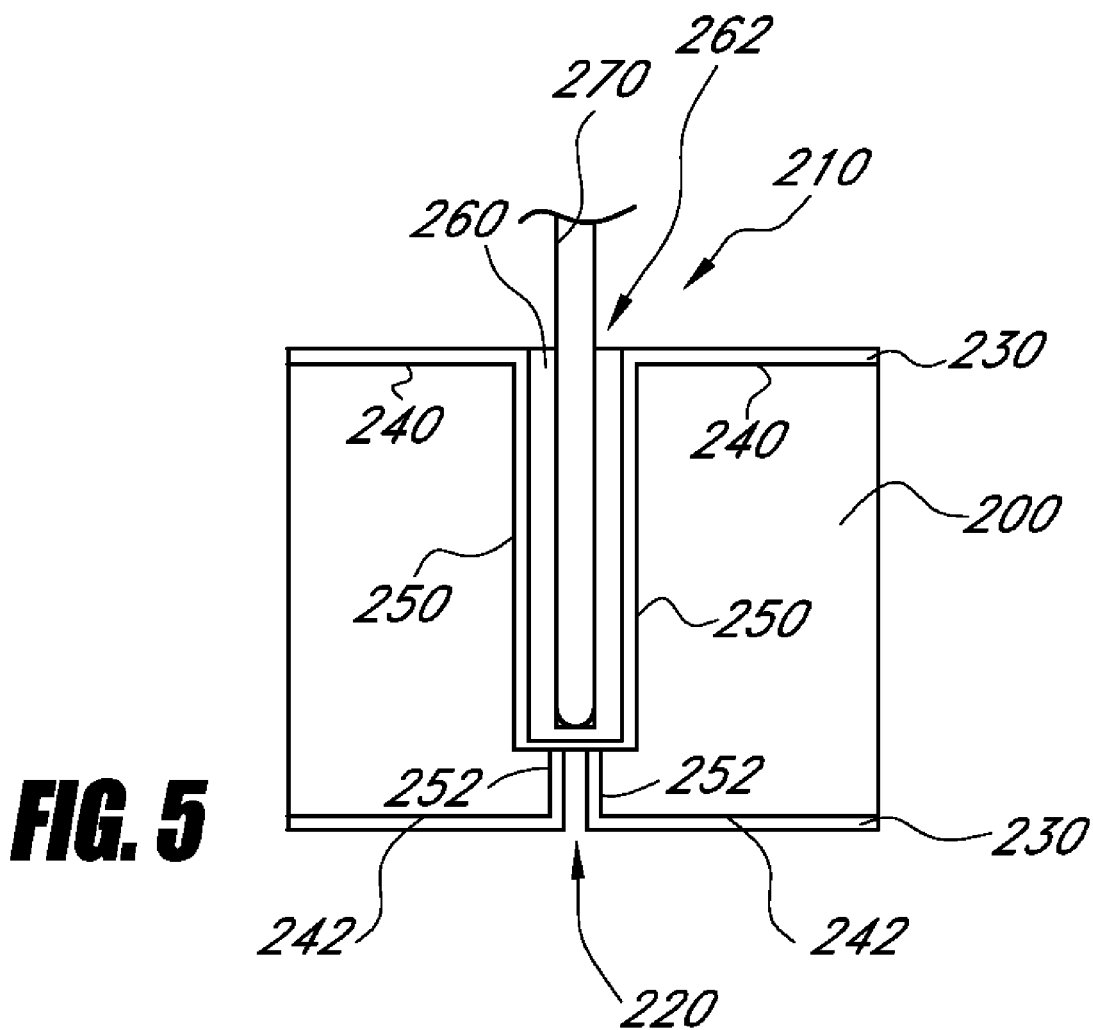
FIG. 5 is a schematic, cross-sectional side view of the structure of FIG. 4 after installing an other reactor part in the insert, in accordance with embodiments of the invention.

With reference to FIG. 5, an other reactor part 270 can be positioned or inserted into the opening 262 of the protective insert 260. The other reactor part 270 may be any reactor part designed to be accommodated within a recess. For example, the other reactor part 270 may be a thermocouple assembly, e.g., the temperature sensors 147, 148 (FIG. 1), for measuring the temperature of within a process chamber.

Figure 6:
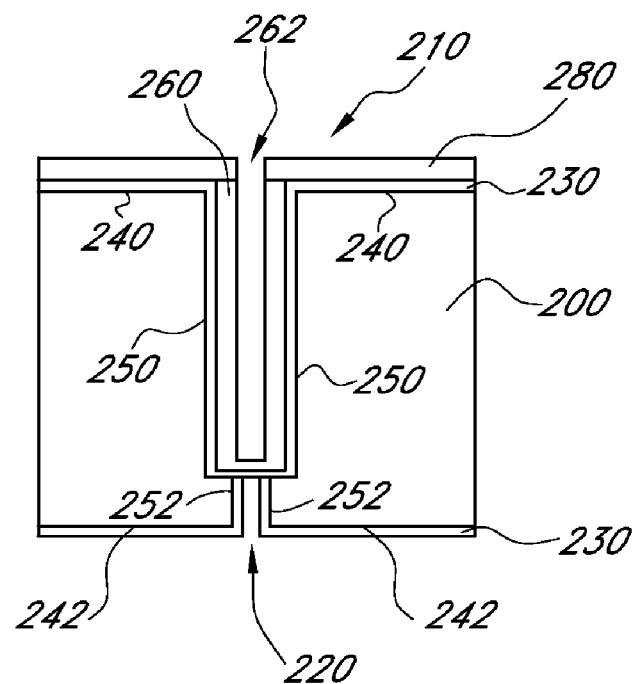
FIG. 6 is a schematic, cross-sectional side view of the structure of FIG. 4 after installing a mechanical clamp, in accordance with embodiments of the invention.

With reference to FIG. 6, instead of or in addition to securing the protective insert 260 into the opening 210 by a tight fit, a fastener 280 may be attached to the reactor part 200 to hold the protective insert 260 in place. For example, the fastener 280 may be a plate that is installed over at least part of the protective insert 260 to prevent the protective insert 260 from dislodging from the opening 210. The fastener 280 may be formed of a material that is resistant to damage by process gases. In some embodiments, the fastener 280 is formed of silicon carbide.

Figure 7:
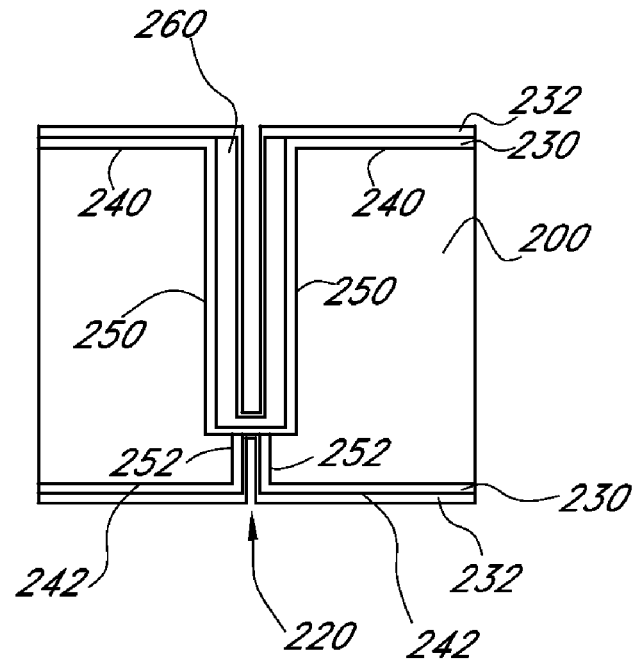
FIG. 7 is a schematic, cross-sectional side view of the structure of FIG. 4 after depositing a second protective layer of material, in accordance with embodiments of the invention.

With reference to FIG. 7, an additional coating 232 may be applied over the exposed surfaces of the protective insert 260 and the reactor part 200. It will be appreciated that the additional coating 232 may be utilized to seal the interface between the protective insert 260 and the reactor part 200, to improve the gas tightness and mechanical integrity of the assembly of the protective insert 260 and the reactor part 200. The additional coating 232 may also help secure the protective insert 260 in the opening 210. In addition, the additional coating may be used to augment the protective coating 230, to provide further material for protecting the reactor part 200. The additional protective coating 232 may be formed of any material suitable for locking the protective insert 260 in place and/or for providing further protection against abrasion. In some embodiments, the additional coating 232 is formed of the same material as the protective coating 230, e.g., the additional coating may be formed of silicon carbide, which can be deposited by, e.g., chemical vapor deposition.

Advantageously, embodiments of the invention can prevent damage to the protective coatings that line surfaces of openings, such as holes or grooves, in reactor parts. Protective inserts provided in the openings form a barrier that prevents mechanical contact between parts inserted into the openings and the walls of the openings. As a result, damage to the walls of the openings caused by abrasion is prevented.

In addition, the protective inserts provide protection for the walls of the openings where there is incomplete coverage of the walls by a protective coating. The protective inserts seal the lower parts of the opening, thereby preventing gas diffusion into those lower parts. Even where the seal between the protective inserts and the walls of the opening are not gas tight, openings between the protective insert and the walls of the opening provide a relatively narrow and long path which limits diffusion of gases to the bottom of the opening, relative to the amount of diffusion allowed by a more loose-fitting part, such as a thermocouple assembly, provided in the hole.

In addition to the above disclosure, it will also be appreciated by those skilled in the art that various omissions, additions and modifications may be made to the methods and structures described above without departing from the scope of the invention. All such modifications and changes are intended to fall within the scope of the invention, as defined by the appended claims.

We claim:

1. A method for fabricating a semiconductor processing reactor part, comprising:
   providing a partially-fabricated reactor part having an opening on a first surface of the partially-fabricated reactor part, the opening extending completely through the reactor part to a second opposing surface, wherein a first width of the opening on the first surface is larger than a second width of the opening on the second surface;
   coating a surface of the opening with a protective coating; and
   subsequently placing a hollow insert into the opening, the insert contacting sidewalls of the opening and having a closed end sealing off a side of the opening open to the first surface from a side of the opening open to the second surface.

2. The method of claim 1, wherein the partially-fabricated reactor part is formed of graphite.

3. The method of claim 2, wherein the protective coating is formed of silicon carbide.

4. The method of claim 3, wherein the insert is formed of silicon carbide.

5. The method of claim 3, further comprising depositing an additional silicon carbide coating on exposed surfaces of the insert and the reactor part after placing the insert into the opening.

6. The method of claim 1, further comprising placing a thermocouple into a hollow cavity in the insert.

7. The method of claim 1, wherein subsequently placing the insert into the opening comprises:
   freezing the insert; and
   subsequently inserting the insert into the opening.

8. The method of claim 7, wherein subsequently placing the insert into the opening further comprises heating the partially-fabricated reactor part before subsequently inserting the insert into the opening.

9. The method of claim 7, wherein subsequently placing the insert into the opening forms a gas-tight seal between the surfaces of the opening and the insert.

10. The method of claim 1, further comprising attaching a fastener to the partially-fabricated reactor part to secure the insert in the opening.

11. The method of claim 1, wherein depositing the protective coating comprises performing a chemical vapor deposition.

12. A method for making a part for a semiconductor processing reactor, comprising:
   providing a first semiconductor reactor part, a first surface of the first reactor part having a hole extending completely through the reactor part to a second opposing surface, wherein a first width of the hole on the first surface is larger than a second width of the opening on the second surface;
   depositing a protective coating on surfaces of the first reactor part and the hole;
   subsequently placing a hollow insert into the hole, the insert contacting sidewalls of the hole and having a closed end sealing off a side of the hole open to the first surface from a side of the hole open to the second surface;
   depositing another protective coating after placing the insert into the hole, wherein the other protective coating coats walls of an opening in the insert; and
   inserting a second semiconductor reactor part into the opening in the insert.

13. The method of claim 12, wherein the first semiconductor reactor part is configured to form a wall of a reaction chamber of the reactor.

14. The method of claim 12, wherein the insert is formed of silicon carbide.

15. The method of claim 12, wherein walls of the insert are formed having a thickness in a range of about 0.05 and about 2 mm.

16. The method of claim 12, wherein the first semiconductor reactor part is provided with a planar surface at least as wide as a major surface of a substrate accommodated in the reaction chamber.

17. The method of claim 16, wherein the first semiconductor reactor part forms a first reactor block configured to interface with a second reactor block positioned opposite the first reactor block such that the first reactor block extends across the major surface of a substrate and the second reactor block extends across an opposite major surface of the substrate upon assembly of the semiconductor reactor and retention of the substrate.

18. The method of claim 17, wherein the second reactor block is provided with a plurality of gas passages on a planar surface facing the major surface of the substrate, the gas passages configured to supply gas to the major surface of the substrate.

19. The method of claim 12, wherein the second reactor part is a thermocouple.

* * * * *